United States Patent
Meyer

[11] Patent Number: 5,818,854
[45] Date of Patent: Oct. 6, 1998

[54] REED-SOLOMON DECODER

[75] Inventor: Jacques Meyer, Corenc, France

[73] Assignee: SGS-Thomson Microelectronics S.A., Saint Genis, France

[21] Appl. No.: 493,852

[22] Filed: Jun. 22, 1995

[30] Foreign Application Priority Data

Jun. 27, 1994 [FR] France .................................. 94 08121

[51] Int. Cl.⁶ .............................................. H03M 13/00
[52] U.S. Cl. ........................................................ 371/37.1
[58] Field of Search ........................................... 371/37.1

[56] References Cited

U.S. PATENT DOCUMENTS

| | | | |
|---|---|---|---|
| 4,584,686 | 4/1986 | Fritze | 371/37 |
| 5,107,503 | 4/1992 | Riggle et al. | 371/37.1 |
| 5,170,399 | 12/1992 | Camberon et al. | 371/37.1 |
| 5,329,535 | 7/1994 | Coker | 371/39.1 |
| 5,396,502 | 3/1995 | Owsley et al. | 371/37.1 |
| 5,563,896 | 10/1996 | Nakaguchi | 371/37.1 |

OTHER PUBLICATIONS

French Search Report from French Patent Application Number 94 08121, filed Jun. 27, 1994.
Elektronik, vol. 41, No. 22, Dec. 1992, Munchen DE, pp. 40–44, Mester, "Gehlerkorrektur in Hochgeschwindigkeit".

*Primary Examiner*—Stephen M. Baker
*Attorney, Agent, or Firm*—Wolf, Greenfield & Sacks, P.C.; James H. Morris

[57] ABSTRACT

A Reed-Solomon decoder receives code sequences of M coefficients having a maximum value N, t of which can be corrected. The Reed-Solomon decoder includes 2t polynomial counters successively receiving the M coefficients of each code sequence, the polynomial counter of rank i (i=0,1 ... 2t-1), providing the coefficient of the term of degree i of a syndrome polynomial. A circuit provides the coefficients of an error locator polynomial from the coefficients of the syndrome polynomial. Another circuit finds the roots of the error locator polynomial by successively trying values $\alpha^1$ to $\alpha^M$. The polynomial counter of rank i is preceded by a multiplier by $\alpha^{(B+i)(N-M)}$, $\alpha^{B+i}$ being the i-th root of the code generator polynomial.

23 Claims, 4 Drawing Sheets ured with coefficients $A_{M-1}$ to
REED-SOLOMON DECODER

BACKGROUND OF THE INVENTION

1. Field of the Invention

The present invention relates to a Reed-Solomon decoder for correcting errors on digital data during a transmission (by electric, radio, or any other suitable signals), and more particularly to Reed-Solomon decoder methods and apparatus for providing, in a suitable order, data to be corrected and the respective correction values.

2. Discussion of the Related Art

Reed-Solomon (RS) encoding consists in providing packets of data to transmit in the form of RS codes, whereby these packets of data may then be extracted from the RS codes and corrected in a receiver. An RS code is a set of M digital data which are associated with coefficients of a polynomial of degree M−1 which is a multiple of a generator polynomial of degree 2t having 2t distinct roots. In transmitting such an RS code, up to t erroneous coefficients can be localized and corrected.

In addition, the coefficients of an RS code are associated with elements of a finite field. Thus, if the coefficients to be transmitted are n-bit numbers, a finite field of $2^n$ elements, noted $GF(2^n)$, will be used. In this finite field an RS code may include up to $N=2^n-1$ coefficients.

In a finite field, additions and multiplications are defined in a specific manner. The multiplication is such that the successive elements of the finite field can be written 0, $\alpha^0$, $\alpha^1$, ... $\alpha^{N-1}$ and that $\alpha^i=\alpha^{i+N}$, where i is an arbitrary positive or negative integer.

To transmit a set of M−2t data $a_{M-2t-1}$, . . . , $a_1$, $a_0$ according to RS encoding (M≦N), the following polynomial is formed:

$$a(x)=a_{M-2t-1} x^{M-2t-1}+ \ldots +a_1 x+a_0.$$

Then, the coefficients of the polynomial $$A(x)=x^{2t} a(x)+r(x),$$

are transmitted, where r(x) is the remainder of the division of polynomial $x^{2t}$ a(x) by the generator polynomial. Thus, the coefficients A of polynomial A(x) constitute an RS code, and the coefficients corresponding to the terms of degrees 2t to N−1 are the effective coefficients a to be transmitted. Of course, the transmission is subject to errors and some of the received coefficients A may be erroneous.

FIG. 1 represents an architecture of a conventional Reed-Solomon decoder, designed to correct up to t erroneous coefficients among the received coefficients A. The received coefficients A are provided to the decoder in the order corresponding to the terms of decreasing degrees of polynomial A(x).

A circuit 10 provides the coefficients of a syndrome polynomial S(x) (hereafter referred to as a syndrome) of degree 2t−1. The coefficient of the term of degree i (i=0, 1, . . . 2t−1) of this syndrome, is expressed as follows:

$$S_i=A(\alpha^{B+i}),$$

where $\alpha^{B+0}$, $\alpha^{B+1}$ . . . $\alpha^{B+2t-1}$ are the roots of the generator polynomial and B is a constant.

FIG. 2 represents a conventional structure of the circuit 10 for providing the coefficients of the syndrome. This structure includes 2t polynomial counters associated with coefficients $S_0$ to $S_{2t-1}$, respectively, of the syndrome. Each polynomial counter associated with a coefficient $S_i$ of the syndrome includes a register 12 preceded by an adder 13. A first input of each adder 13 successively receives coefficients $A_{M-1}$ to $A_0$. A second input of each adder 13 receives an output of a register 12 multiplied by $\alpha^{B+i}$ by a multiplier 14.

Each time a coefficient $A_j$ arrives, the content of each register 12 is replaced with its initial content increased by $A_j \alpha^{B+i}$. At the arrival of coefficient $A_{M-1}$, register 12 contains the value of polynomial A(x) for $x=\alpha^{B+i}$, i.e., the coefficient $S_i$ of the syndrome. Coefficients A must be provided to the polynomial counters in the order corresponding to the terms of decreasing degrees of polynomial A(x).

A circuit 20 of FIG. 1 provides, from the syndrome coefficients, the coefficients of a so-called error locator polynomial λ(x), of a degree smaller than or equal to t, and coefficients of a so-called error correction polynomial R(x), of a degree smaller than t, such that $$x^{2t} \gamma(x)+\lambda(x)S(x)=R(x),$$

where γ(x) is a polynomial which is not to be determined.

The error locator polynomial λ(x) has, at most, t distinct roots. If $\alpha^r$ (r=0, 1, . . . M−1) is a root of polynomial λ(x), coefficient $A_{N-r}$ has been transmitted with an error. The error on this coefficient is expressed as follows:

$$e_r=R(\alpha^r)/\alpha^r \lambda'(\alpha^r) \quad (1)$$

where λ' is the derivative polynomial of polynomial λ.

To calculate the coefficients of polynomials λ(x) and R(x), circuit 20 uses the Euclid algorithm.

The article of IEEE Transactions on Computers, Vol. C-34, No. 5, May 1985, "A VLSI Design of a Pipeline Reed-Solomon Decoder" describes an exemplary use of the Euclid algorithm and a circuit for carrying out the Euclid algorithm in this example.

A circuit 30 in FIG. 1 is used to find, from the coefficients of polynomials λ(x) and R(x), the roots of polynomial λ(x) and to calculate the errors according to equation (1). Circuit 30 includes a first part 37 for finding the roots of the error locator polynomial, and a second part 39 for providing errors $e_0, \ldots, e_{M-1}$.

FIG. 3 represents a conventional structure of the first part 37 for finding the roots of the error locator polynomial λ(x). This conventional structure successively calculates the values of polynomial λ(x) for the successive values $\alpha^0, \alpha^{-1} \ldots, \alpha^{1-M}$ of x. Instead of providing M polynomial counters to calculate the values of polynomial λ(x) for each value $\alpha^0$ to $\alpha^{1-M}$, which would require a large surface, t+1 calculation cells respectively associated with coefficients $\lambda_0$ to $\lambda_t$ of polynomial λ(x) are provided.

Each cell associated with a coefficient $\lambda_i$ includes a register 32 preceded by a multiplier 33 having a first input that receives an output of register 32 and a second input that receives value $\alpha^{-i}=\alpha^{N-i}$.

The outputs of registers 32 are provided to the respective inputs of an adder 34.

Initially, coefficients $\lambda_0$ to $\lambda_t$ are written in respective registers 32. Adder 34 thus provides the value of polynomial λ(x) for $x=\alpha^0=1$.

Then, writing in registers 32 is enabled at each of M−1 successive steps. Thus, at the (j-i)th step, the register 32 associated with coefficient $\lambda_i$ contains value $\lambda_i \alpha^{-ij}$. Adder 34 provides the value of polynomial λ(x) for $x=\alpha^{-j}$.

Thus, the structure of FIG. 3 provides, during M successive steps, the values of polynomial λ(x) for the successive values $\alpha^0$ to $\alpha^{1-M}$ of x. At each of these steps, the corresponding error e is calculated. If at a step r, adder 34 provides a non-null value, error $e_r$ is zero. Otherwise, error $e_r$ is calculated according to equation (1). As a result, errors e are calculated in the order corresponding to the coefficients of the terms of increasing degrees of polynomial A(x).

As represented in FIG. 1, errors $e_0$ to $e_{M-1}$ are successively provided to a first input of adder 36. Simultaneously, adder 36 receives at a second input the corresponding coefficients A, i.e., successively $A_0$ to $A_{M-1}$. Coefficients A are provided to adder 36 through a delay and order inversion circuit 40. The introduced delay is intended to compensate for M calculation steps of the coefficients of the syndrome by circuit 10 and for 2t steps needed to provide the coefficients of polynomials λ(x) and R(x) by circuit 20. The order of transmission of the corrected coefficients A provided by adder 36 is again inverted by an order inverting circuit 42 to restore the initial transmission order. This is necessary to avoid a latency which would be caused in providing the 2t coefficients of lowest degree of polynomial A, which do not correspond to desired coefficients a.

Thus, a conventional Reed-Solomon decoder needs two inverting circuits each of which includes at least M flip-flops which are controlled by complex circuitry.

SUMMARY OF THE INVENTION

An object of the present invention is to provide a Reed-Solomon decoder capable of providing the errors of the coefficients to be processed in the order of the initial transmission of these coefficients.

To achieve this object, the present invention is based on the inversion of the order of trial of the roots of polynomial λ(x), i.e., instead of trying values $\alpha^0$ to $\alpha^{1-M}$, values $\alpha^1$ to $\alpha^M$ are tried, which can also be achieved by the successive trial structure of FIG. 3. However, when directly proceding so, the indexes of the corresponding coefficients to correct would be N−1 to N−M which only correspond to coefficients $A_{M-1}$ to $A_0$ in the particular case where M=N.

For applying the inversion of the trial order in general, it is assumed, according to the invention, that the M coefficients $A_{M-1}$ to $A_0$ are the coefficients of terms of highest degree of a polynomial of degree N−1 whose N−M terms of lowest degree are null. For this purpose, it is sufficient, in the circuit for calculating the coefficients of the syndrome, to use the polynomial $x^{N-M} A(x)$ instead of polynomial A(x).

In another illustrative embodiment, the present invention provides a Reed-Solomon decoder receiving sequences of M n-bit data corresponding to coefficients of polynomials of degree M−1, these polynomials being multiples of a generator polynomial having successive roots $\alpha^B$ to $\alpha^{B+2t-1}$, where B is an integer constant. The coefficients are associated with elements of a finite field of $N+1=2^n$ elements among which α is a non-zero and non-unity element. The decoder includes 2t polynomial counters successively receiving the M data of each sequence, the polynomial counter of rank i (i=0,1 ... 2t−1) provides the coefficient of the term of degree i of a syndrome polynomial, equal to the value of the polynomial of degree M−1 for the root $\alpha^{B+i}$, this polynomial counter of rank i being preceded by a multiplier by $\alpha^{(B+i)(N-M)}$. A circuit provides the coefficients of an error locator polynomial of degree at most equal to t, from the coefficients of the syndrome polynomial. Another circuit finds the roots of the error locator polynomial by successively trying values $\alpha^1$ to $\alpha^M$.

According to an embodiment of the invention, if N=k(N−M) (where k is an integer), the decoder includes k multipliers by $\alpha^{B(N-M)}, \alpha^{(B+1)(N-M)}, \ldots \alpha^{(B+k-1)(N-M)}$, respectively, the multiplier of rank i (i=0, 1, ... k−1) precedes the polynomial counters of ranks i+pk, where p varies from 0 to the integer part of (2t−i−1)/k.

According to an embodiment of the invention, the circuit for calculating the roots of the error locator polynomial includes, for each coefficient of term of degree i of the error locator polynomial, a register initially storing this coefficient, and a multiplier connected to successively replace the content of the register with its preceding content multiplied by $\alpha^i$, the output of each multiplier being provided to a respective input of an adder.

The foregoing and other objects, features, aspects and advantages of the invention will become apparent from the following detailed description of the present invention when taken in conjunction with the accompanying drawings.

DETAILED DESCRIPTION

To correct M coefficients $A_{M-1}$ to $A_0$ of an RS code without modifying their order of arrival, the present invention processes the M coefficients as if they corresponded to the terms of highest degree of a polynomial of degree N−1, wherein the N−M terms of lowest degree are considered null (N is the number of non-null elements of the used finite field and M is the number of coefficients of each RS code). This is equivalent to multiplying an initial polynomial A(x) by $x^{N-M}$. The obtained coefficients of polynomial $x^{N-M} A(x)$ also constitute RS codes since the roots of polynomial A(x) are also roots of polynomial $x^{N-M} A(x)$.

With this method, the calculation of the coefficients of the syndrome is modified since the coefficient of the term of degree i is now expressed by $$S_i = \alpha^{(B+i)(M-N)} A(\alpha^{B+i}).$$

Figure 2:
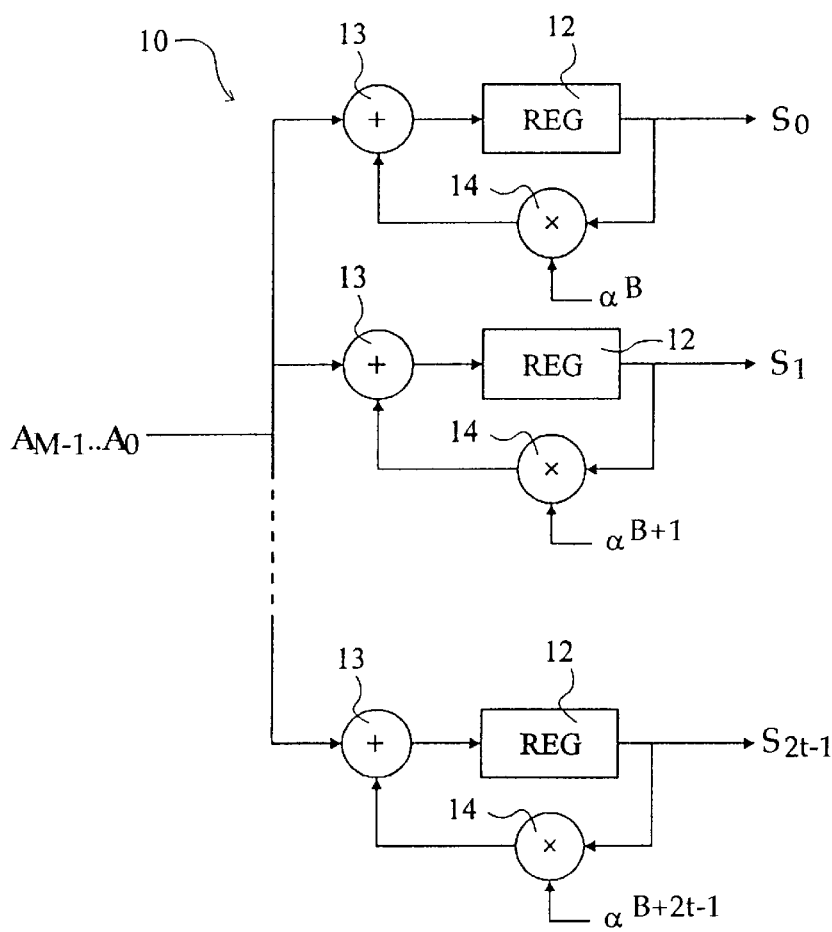
FIG. 2, above described, schematically represents a conventional architecture of a circuit for calculating syndrome coefficients.
Figure 4:
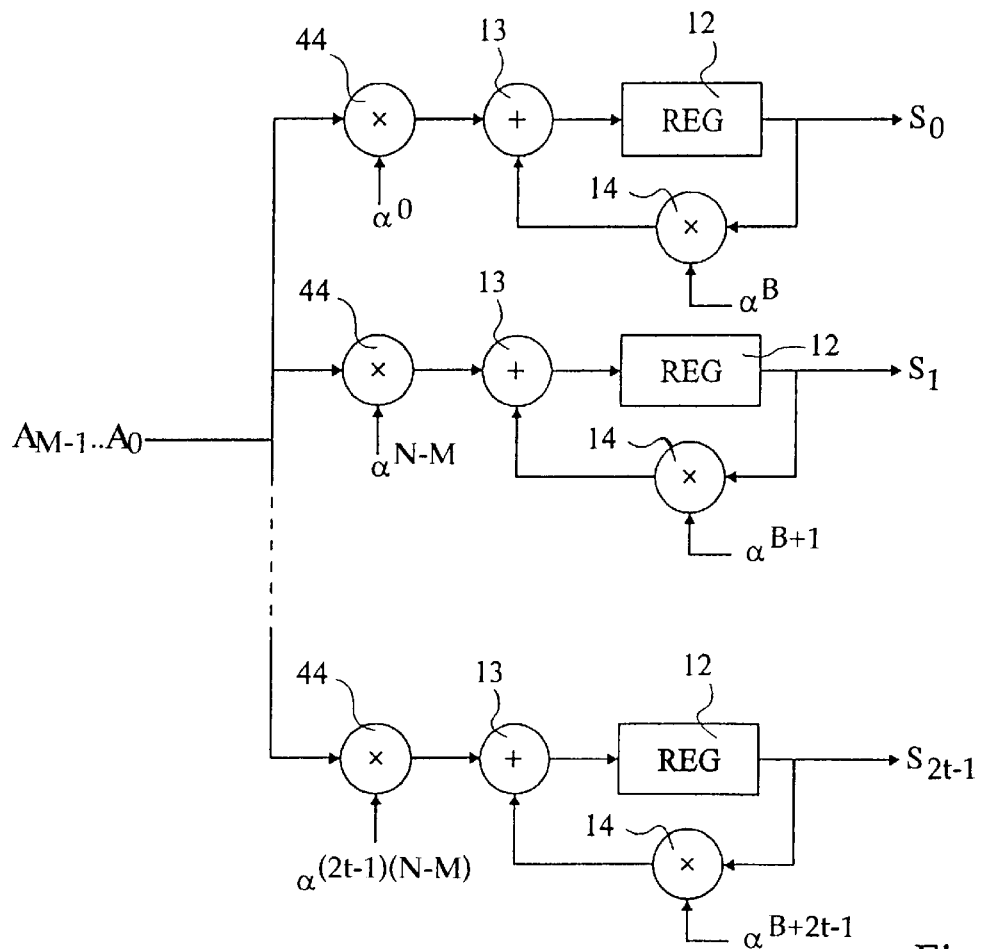
FIG. 4 represents an embodiment of a circuit for calculating the coefficients of a syndrome according to the present invention.

FIG. 4 represents an embodiment of a circuit for calculating the coefficients of the syndrome according to the invention. The same elements represented in FIG. 2 are designated with the same reference numbers. The circuit of FIG. 4 differs from the circuit of FIG. 2 in that each polynomial counter associated with a coefficient $S_i$ is preceded by a multiplier 44 by $\alpha^{(B+i)(N-M)}$.

Figure 1:
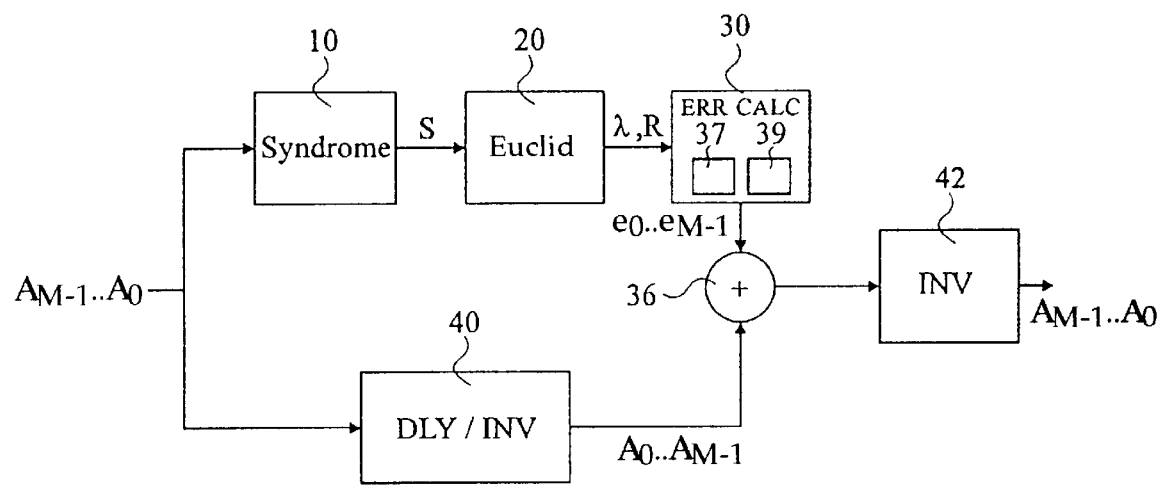
FIG. 1, above described, schematically represents an architecture of a conventional Reed-Solomon decoder.
Figure 5:
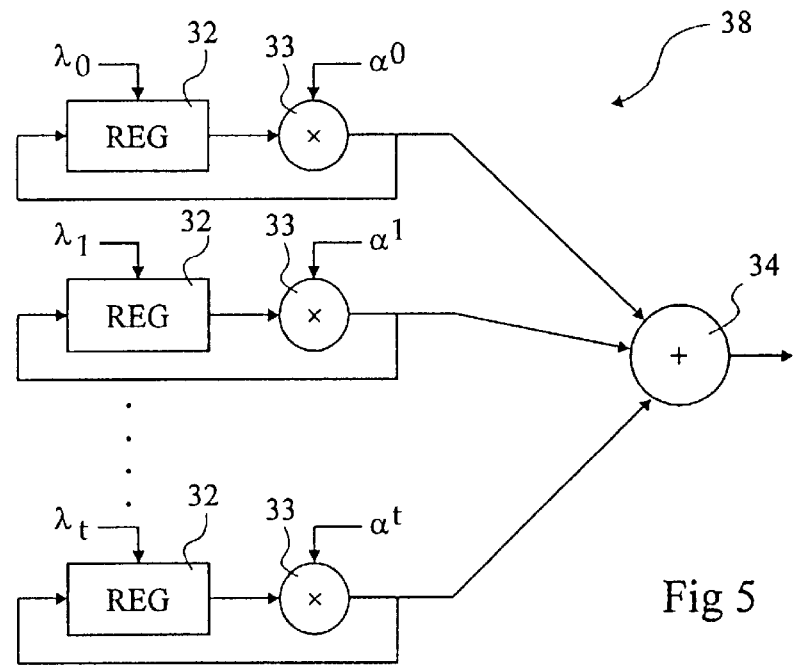
FIG. 5 represents an embodiment of a successive root trial circuit according to the invention.
Figure 7:
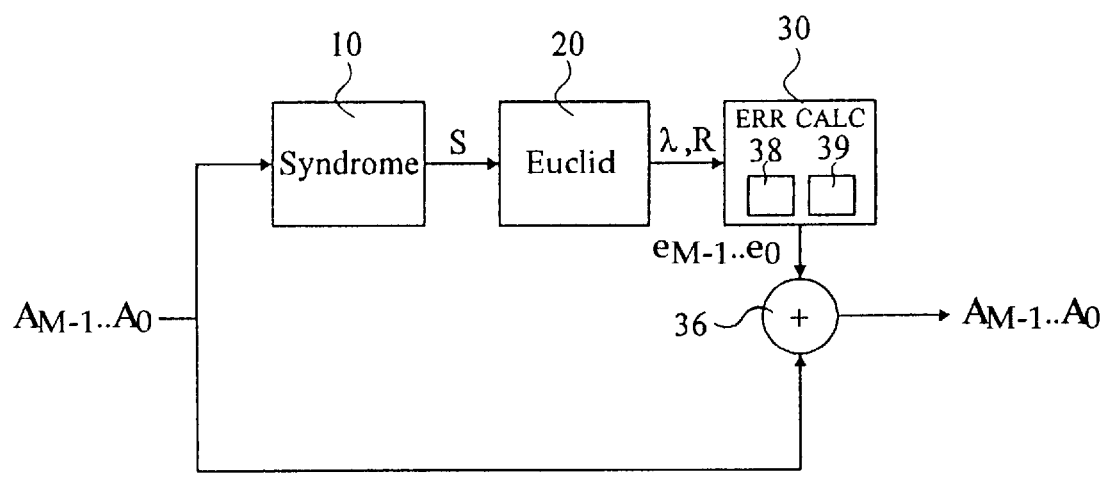
FIG. 7 represents an architecture of a Reed-Solomon decoder according to the invention.

FIG. 5 represents an embodiment of a circuit 38 (see FIG. 7) for determining the roots of the error locator polynomial λ(x), by successive trial of values $\alpha^1$ to $\alpha^M$. The M successive tried values according to this order correspond to the coefficients of terms of degrees N−1 to N−M of a polynomial of degree N−1. Because of the multiplication of polynomial A(x) by $x^{N-M}$, these coefficients correspond to the coefficients $A_{M-1}$ to $A_0$. Since the values are tried in the order of arrival of coefficients A, the order inversion circuit 42 of FIG. 1 and the order inversion control in the delay circuit 40 need not be provided (see FIG. 7), which allows significant simplification of the decoder. The circuit 39 provides errors $e_{M-1}, \ldots, e_0$.

Figure 3:
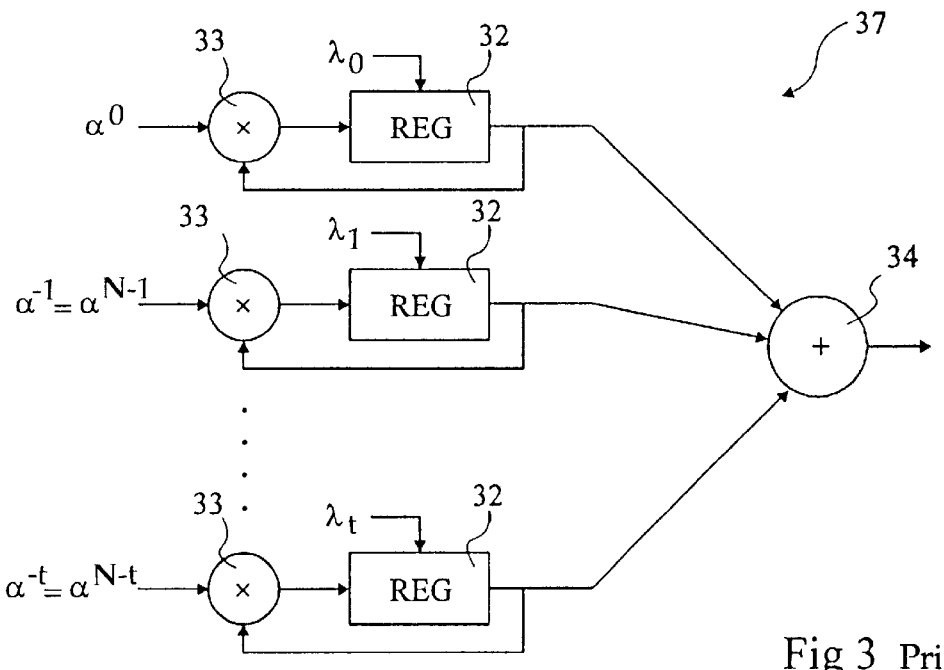
FIG. 3, above described, schematically represents a conventional architecture of a circuit for successively trying the roots of an error location polynomial.

In the circuit of FIG. 5 designed for successive trial, the same elements represented in FIG. 3 are designated with the same reference numbers. However, the structure is different from the structure of FIG. 3 in that adder 34 receives the outputs of multipliers 33 instead of the outputs of registers 32 and in that each multiplier 33 associated with a coefficient $\lambda_i$ receives value $\alpha^i$ instead of $\alpha^{-i}$.

Initially, the coefficients $\lambda_0$ to $\lambda_t$ are written in the respective registers 32. Adder 34 thus provides the value of polynomial $\lambda(x)$ for $x=\alpha^1$. During M−1 additional steps, the writing in registers 32 is enabled and adder 34 provides the values of polynomial $\lambda(x)$ while x varies from $\alpha^2$ to $\alpha^{M-1}$.

Figure 6:
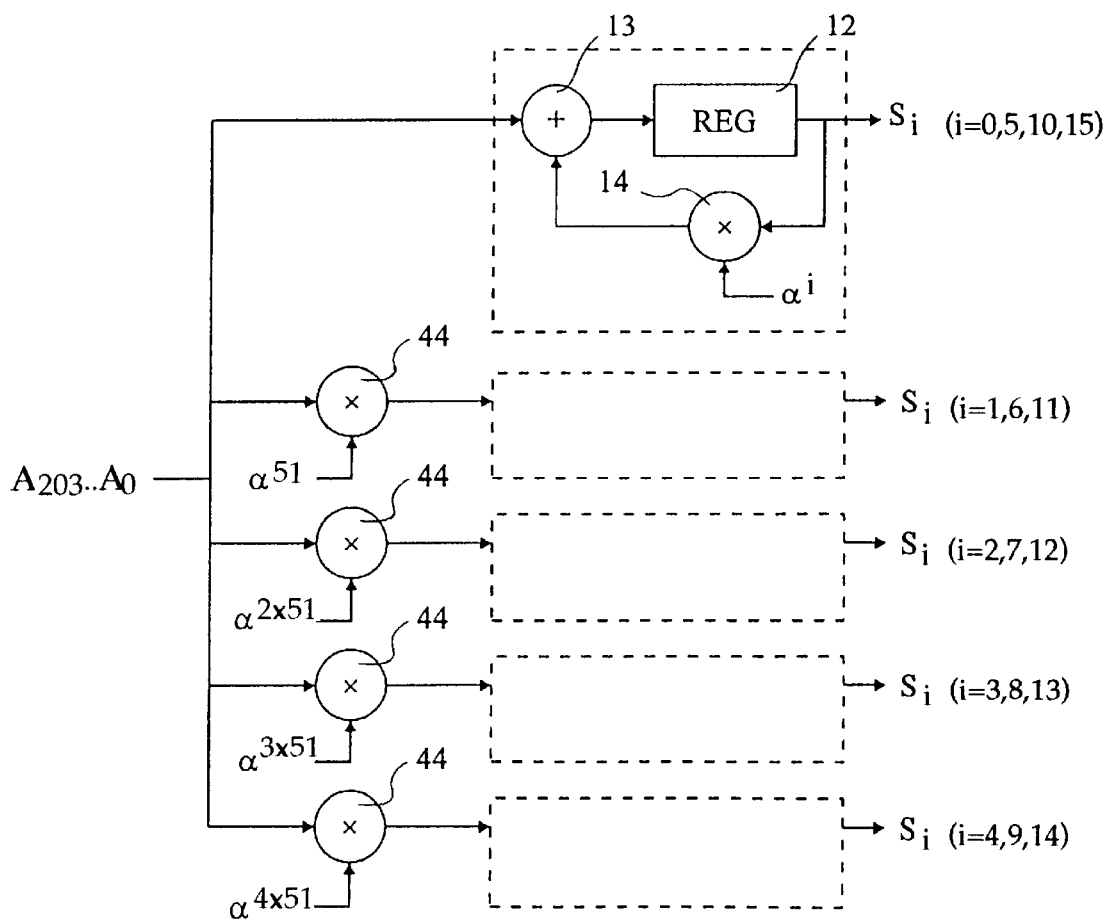
FIG. 6 represents an optimized embodiment of a circuit for calculating the coefficients of a syndrome.

FIG. 6 represents a simplified embodiment of the circuit of FIG. 4 for calculating the syndrome coefficients in the particular case where N is a multiple of N−M (N=k(N−M)). In this case, each multiplier 44 associated with a coefficient $S_i$ executes the same multiplication as the multiplier associated with coefficient $S_{i-k}$. Accordingly, multiplier 44 associated with coefficient $S_i$ can be omitted and the corresponding polynomial counter is supplied by a multiplier 44 associated with coefficient $S_{i-k}$.

FIG. 6 shows the resulting simplification with an example where N=255, M=204, B=0, and t=8, corresponding to the European standard for cable or satellite transmission of RS codes in digital television. In this case, N=5(N−M) and N−M=51. The polynomial counters associated with coefficients $S_0$, $S_5$, $S_{10}$ and $S_{15}$ are directly supplied with the coefficients $A_{203}$ to $A_0$. The polynomial counters associated with the coefficients $S_1$, $S_6$ and $S_{11}$ are preceded by a multiplier by $\alpha^{51}$. The polynomial counters associated with the coefficients $S_2$, $S_7$ and $S_{12}$ are preceded by a multiplier by $\alpha^2 x^{51}$. The polynomial counters associated with coefficients $S_3$, $S_8$ and $S_{13}$ are preceded by a multiplier by $\alpha^3 x^{51}$. Finally, the polynomial counters associated with coefficients $S_4$, $S_9$ and $S_{14}$ are preceded by a multiplier by $\alpha^4 x^{51}$.

In this example, four multipliers are used at the inputs of the polynomial counters instead of the 15 normally needed.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A Reed-Solomon decoder for receiving sequences of M n-bit data that correspond to coefficients of code polynomials of degree M−1, the code polynomials being multiples of a generator polynomial having successive roots $\alpha^B$ to $\alpha^{B+2t-1}$, wherein B is an integer constant, the coefficients of the code polynomials being associated with elements of a finite field of $N+1=2^n$ elements, wherein $\alpha$ is a non-zero and non-unity element, the decoder comprising:

2t polynomial counters having successive ranks 0 through 2t−1, that successively receive M data of a sequence and provide coefficients of a syndrome polynomial according to the M data of the sequence, wherein one of the polynomial counters has a rank i and provides a coefficient $S_i$ of a term of degree i of the syndrome polynomial, the coefficient $S_i$ being equal to a value of the code polynomial of degree M−1 for a root $\alpha^{B+i}$ of the successive roots $\alpha^B$ to $\alpha^{B+2t-1}$;

a multiplier by a value $\alpha^{(B+i)(N-M)}$ having a first input that receives the M data of the sequence, a second input that receives the value $\alpha^{(B+i)(N-M)}$, and an output that provides a product of the M data sequence and the value $\alpha^{(B+i)(N-M)}$ to the one of the polynomial counters having the rank i;

an error locator polynomial circuit that provides coefficients of an error locator polynomial of degree at most equal to t, from the coefficients of the syndrome polynomial; and a root finding circuit that finds roots of the error locator polynomial by successively trying values $\alpha^1$ to $\alpha^M$.

2. The Reed-Solomon decoder of claim 1, wherein N=k (N−M), k being an integer, and wherein the decoder further comprises:

k multipliers having successive ranks 0 through k−1, that multiply the coefficients of the code polynomials by $\alpha^{(B+k-1)(N-M)}$, respectively, wherein one of the multipliers has a rank i and precedes the polynomial counters of ranks i+pk, wherein p varies from 0 to an integer part of (2t−i−1)/k, and wherein the k multipliers includes the multiplier by the value $\alpha^{(B+i)(N-M)}$.

3. The Reed-Solomon decoder of claim 1, wherein said root finding circuit includes, for each coefficient of a term of degree j of the error locator polynomial, a respective register initially storing said coefficient and a multiplier connected to the respective register that successively replaces a content of the register with a preceding content multiplied by $\alpha^j$, wherein j is between 0 and t, an output of each multiplier being provided to a respective input of an adder.

4. The Reed-Solomon decoder of claim 1, wherein N=255, M=204, B=0, and t=8.

5. The Reed-Solomon decoder of claim 1, wherein the root finding circuit includes:

root determining circuitry that determines the roots of the error locator polynomial according to a successive trial of the values $\alpha^1$ to $\alpha^M$ to match an order of arrival of the coefficients of the code polynomials.

6. A Reed-Solomon decoder for decoding a code sequence of digital values, the code sequence corresponding to a code polynomial having a plurality of code coefficients, each digital value corresponding to one of the plurality of code coefficients of the code polynomial, the code polynomial being a multiple of a generator polynomial, the decoder comprising:

a syndrome polynomial generating circuit that receives the code polynomial and generates a syndrome polynomial having a plurality of syndrome coefficients, according to the code polynomial, the syndrome polynomial generating circuit including:

a terminal that receives the code sequence, a plurality of polynomial counters, each polynomial counter corresponding to a respective one of the plurality of syndrome coefficients having a first input coupled to the terminal, a second input that receives a root of the generator polynomial, and an output that provides the respective syndrome coefficient of the syndrome polynomial, and at least one multiplier interconnected between the terminal and at least one of the plurality of polynomial counters, each multiplier having a first input coupled to the terminal, a second input that receives a predetermined value, and an output coupled to the first input of the at least one polynomial counter;

an error locator polynomial generating circuit, coupled to an output of the syndrome polynomial generating circuit, that generates an error locator polynomial according to the syndrome polynomial; and decoding circuitry, coupled to an output of the error locator polynomial generating circuit, that decodes the code sequence according to the error locator polynomial.

7. The Reed-Solomon decoder of claim 6, wherein the at least one multiplier includes:

a plurality of multipliers interconnected between the terminal and the plurality of polynomial counters, the first input of each polynomial counter being coupled to an output of one of the plurality of multipliers.

8. The Reed-Solomon decoder of claim 6, wherein the syndrome polynomial has a degree of 2t−1, wherein each syndrome coefficient is associated with a term of degree 0 through 2t−1, wherein each polynomial counter is ranked according to the degree of the term associated with the syndrome coefficient corresponding to the polynomial counter, wherein M is a positive integer, wherein the code polynomial has a degree of M−1, wherein each digital value of the code sequence has n bits, wherein N is a multiple of N−M so that k=N/(N−M), and wherein the at least one multiplier includes:

k multipliers ranked 1 through k and interconnected between the terminal and the respective polynomial counter, wherein the first input of each polynomial counter of rank i+pk is coupled to an output of a multiplier of rank i, p being between 0 and an integer part of (2t−i−1)/k.

9. The Reed-Solomon decoder of claim 6, wherein the decoding circuitry includes:

a error detecting circuit, coupled to the output of the error locator polynomial generating circuit, that provides an error detection signal indicating whether an error exists in the code sequence; and an error sequence circuit, responsive to the error detection signal, that provides an error sequence of error values to correct the code sequence.

10. The Reed-Solomon decoder of claim 9, wherein the code polynomial has a degree of M−1 and each code coefficient of the code polynomial is associated with a term having a degree between 0 and M−1, and wherein the decoding circuitry further includes:

a decoding adder having a first input that serially receives the code coefficients of the code polynomial, wherein a code coefficient associated with a term of higher degree is received before a code coefficient associated with a term of lower degree, a second input that serially receives the error sequence, and an output that provides a corrected sequence.

11. The Reed-Solomon decoder of claim 10, wherein the error detecting circuit includes:

a plurality of calculating cells, each calculating cell including:

a register having a first input that receives a respective error locator coefficient of the error locator polynomial, a second input, and an output, and a multiplier having a first input coupled to the output of the register, a second input that receives a predetermined number, and an output coupled to the second input of the register; and an error detection adder having a plurality of inputs, each input being coupled to the output of the multiplier of the respective calculating cell, and an output that provides the error detection signal.

12. A method for Reed-Solomon decoding of a code sequence of digital values, the code sequence corresponding to a code polynomial having a plurality of code coefficients, each digital value of the code sequence corresponding to one of the plurality of code coefficients of the code polynomial, the code polynomial being a multiple of a generator polynomial, the method comprising the steps of:

A. generating a syndrome polynomial having a plurality of syndrome coefficients, according to the code polynomial, by multiplying each of the code coefficients by at least one predetermined value to calculate the plurality of syndrome coefficients;

B. generating an error locator polynomial according to the syndrome polynomial; and C. decoding the code sequence according to the error locator polynomial.

13. The method of claim 12, wherein step A includes the step of:

multiplying the code coefficients of the code polynomial by each of a plurality of predetermined values to calculate each one of the plurality of syndrome coefficients of syndrome polynomial.

14. The method of claim 12, wherein the syndrome polynomial has a degree of 2t−1, wherein each syndrome coefficient is associated with a term of degree 0 through 2t−1, wherein M is a positive integer, wherein the code polynomial has a degree of M−1, wherein each digital value of the code sequence has n bits, wherein N is a multiple of N−M so that k=N/(N−M), and wherein step A includes the step of:

applying the code sequence to k multipliers ranked 1 through k coupled to a plurality of polynomial counters, wherein each polynomial counter is ranked according to the degree of the respective term associated with the syndrome coefficient, to calculate the plurality of syndrome coefficients, wherein the first input of each polynomial counter of rank i+pk is coupled to an output of a multiplier of rank i, p being between 0 and an integer part of (2t−i−1)/k.

15. The method of claim 12, wherein step C includes the steps of:

generating an error detection signal according to the error locator polynomial, the error detection signal indicating whether an error exists in the code sequence; and generating an error sequence of error values to correct the code sequence when the error detection signal indicates an existence of the error in the code sequence.

16. The method of claim 15, wherein the code polynomial has a degree of M−1 and each code coefficient of the code polynomial is associated with a term having a degree between 0 and M−1, and wherein step C further includes the steps of:

serially receiving the code coefficients of the code polynomial, wherein a code coefficient associated with a term of higher degree is received before a code coefficient associated with a term of lower degree;

serially receiving the error sequence; and adding the code coefficients of the code polynomial and the error sequence to provide a corrected sequence.

17. The method of claim 16, wherein the step of generating an error detection signal includes the step of:

storing, in a plurality of registers, respective error locator coefficients of the error locator polynomial as contents of the plurality of registers, outputting the contents of the plurality of registers to a plurality of multipliers that multiply the contents by a set of predetermined numbers, to generate new values at outputs of the plurality of multipliers, and adding the new values at the outputs of the plurality of multipliers to calculate the error detection signal.

18. A Reed-Solomon decoder for decoding a code sequence of digital values, the code sequence corresponding to a code polynomial having a plurality of code coefficients, each digital value of the code sequence corresponding to one of the plurality of code coefficients of the code polynomial, the code polynomial being a multiple of a generator polynomial, the decoder comprising:

means for generating a syndrome polynomial having a plurality of syndrome coefficients, according to the code polynomial, by multiplying each of the code coefficients by at least one predetermined value to calculate the plurality of syndrome coefficients;

an error locator polynomial circuit coupled to the means for generating, that generates an error locator polynomial according to the syndrome polynomial; and a decoder circuit coupled to the error locator polynomial circuit, that decodes the code sequence according to the error locator polynomial.

19. The decoder of claim 18, wherein the means for generating a syndrome polynomial includes:

a plurality of multipliers that multiply the respective code coefficients of the code polynomial by the at least one predetermined value to calculate each one of the plurality of syndrome coefficients of syndrome polynomial.

20. The decoder of claim 18, wherein the syndrome polynomial has a degree of 2t−1, wherein each syndrome coefficient is associated with a term of degree 0 through 2t−1, wherein M is a positive integer, wherein the code polynomial has a degree of M−1, wherein each digital value of the code sequence has n bits, wherein N is a multiple of N−M so that k=N/(N−M), and wherein the means for generating includes:

k multipliers, ranked 1 through k, coupled to a plurality of polynomial counters, wherein each polynomial counter is ranked according to the degree of the respective term associated with the syndrome coefficient, to calculate the plurality of syndrome coefficients, wherein a first input of each polynomial counter of rank i+pk is coupled to an output of a multiplier of rank i, p being between 0 and an integer part of (2t−i−1)/k.

21. The decoder of claim 18, wherein the decoder includes:

an error detection signal generating circuit that generates an error detection signal according to the error locator polynomial, the error detection signal indicating whether an error exists in the code sequence; and an error sequence generating circuit coupled to the error detection signal generating circuit, that generates a error sequence of error values to correct the code sequence when the error detection signal indicates an existence of an error in the code sequence.

22. The decoder of claim 21, wherein the code polynomial has a degree of M−1 and each code coefficient of the code polynomial is associated with a term having a degree between 0 and M−1, and wherein the decoder further includes:

an adder having a first input that serially receives the code coefficients of the code polynomial, wherein a code coefficient associated with a term of higher degree is received before a code coefficient associated with a term of lower degree, a second input that serially receives the error sequence, which adds the code coefficients to the error sequence and an output that outputs a corrected sequence.

23. The decoder of claim 22, wherein the error detection signal circuit includes:

a plurality of calculating cells, each calculating cell including
a register having a first input that receives a respective error locator coefficient of the error locator polynomial, a second input, and an output, and
a multiplier having a first input coupled to the output of the register, a second input that receives a predetermined number, and an output coupled to the second input of the register; and an error detection adder having a plurality of inputs, each input being coupled to the output of the multiplier of the respective calculating cell, and an output that provides the error detection signal.

* * * * *